United States Patent
Ravid et al.

(10) Patent No.: US 10,720,675 B2
(45) Date of Patent: Jul. 21, 2020

(54) SYSTEM AND METHOD FOR PROLONGING BATTERY LIFE

(71) Applicant: Nova Lumos Ltd., Netanya (IL)

(72) Inventors: Ilan Ravid, Tel Aviv (IL); Nir Marom, Tzur Moshe (IL); David Vortman, Tzur Moshe (IL); Nir Nitzani, Kefar Sava (IL); Rafael Boneh, Tel Aviv (IL)

(73) Assignee: Nova Lumos Ltd., Netanya (IL)

( * ) Notice: Subject to any disclaimer, the term of this patent is extended or adjusted under 35 U.S.C. 154(b) by 344 days.

(21) Appl. No.: 15/614,989

(22) Filed: Jun. 6, 2017

(65) Prior Publication Data

US 2017/0353045 A1   Dec. 7, 2017

Related U.S. Application Data

(60) Provisional application No. 62/346,803, filed on Jun. 7, 2016.

(51) Int. Cl.

| | |
|---|---|
| *H01M 10/44* | (2006.01) |
| *G01R 31/36* | (2020.01) |
| *H01M 10/0525* | (2010.01) |
| *G01R 31/385* | (2019.01) |
| *G01R 31/392* | (2019.01) |
| *H01M 10/42* | (2006.01) |

(Continued)

(52) U.S. Cl.
CPC ........ *H01M 10/44* (2013.01); *G01R 31/3648* (2013.01); *G01R 31/385* (2019.01); *G01R 31/392* (2019.01); *G01R 31/44* (2013.01); *H01M 10/0525* (2013.01); *H01M 10/42* (2013.01); *H02J 7/00711* (2020.01); *H01M 2220/30* (2013.01)

(58) Field of Classification Search
CPC .. H01M 10/44; H01M 10/0525; H01M 10/42; H01M 2220/30; G01R 31/385; G01R 31/392; G01R 31/3648; G01R 31/44; H02J 7/0093
See application file for complete search history.

(56) References Cited

U.S. PATENT DOCUMENTS

| | | |
|---|---|---|
| 3,980,996 A | 9/1976 | Greenspan et al. |
| 4,009,051 A | 2/1977 | Kazis et al. |

(Continued)

*Primary Examiner* — Regis J Betsch
(74) *Attorney, Agent, or Firm* — The Roy Gross Law Firm, LLC; Roy Gross

(57) ABSTRACT

A system and method for prolonging a useful lifetime of an energy storage. The method includes: determining, based on a first set of test storage data of the test energy storage, a first set of test configuration parameters comprising a first maximum charge level for the test energy storage, wherein the first set of test configuration parameters corresponds to a first estimated useful life; determining, based on a second set of test storage data of the test energy storage, a second set of test configuration parameters comprising a second maximum charge level for the test energy storage, wherein the second set of test configuration parameters corresponds to a second estimated useful life; and sending, to a controller of the test energy storage, reconfiguration instructions, wherein the reconfiguration instructions are based on the second set of test configuration parameters, wherein the second estimated useful life is longer than the first estimated useful life.

13 Claims, 6 Drawing Sheets

(51) Int. Cl.
*G01R 31/44* (2020.01)
*H02J 7/00* (2006.01)

(56) References Cited

U.S. PATENT DOCUMENTS

| | | |
|---|---|---|
| 5,221,891 A | 6/1993 | Janda et al. |
| 6,819,079 B2 | 11/2004 | Karapetyan et al. |
| 7,099,141 B1 * | 8/2006 | Kaufman .............. H01G 2/14 361/275.1 |
| 7,202,457 B2 | 4/2007 | Janus et al. |
| 8,269,374 B2 * | 9/2012 | De Caires .............. H02J 7/35 307/66 |
| 8,684,190 B2 | 4/2014 | Abar |
| 2003/0184307 A1 * | 10/2003 | Kozlowski ............ B60L 3/0046 324/427 |
| 2003/0206021 A1 * | 11/2003 | Laletin ................ G01R 31/386 324/426 |
| 2005/0017685 A1 * | 1/2005 | Rees .................... G01R 31/392 320/132 |
| 2005/0182927 A1 | 8/2005 | Shatford |
| 2007/0210742 A1 * | 9/2007 | Brecht ................ H02J 7/0091 320/104 |
| 2011/0037436 A1 * | 2/2011 | Seethaler .......... H02M 3/33507 320/137 |
| 2014/0358367 A1 * | 12/2014 | Copeland ............ B60R 16/03 701/36 |
| 2015/0046109 A1 | 2/2015 | Miwa |
| 2015/0159869 A1 | 6/2015 | Stevenson et al. |
| 2016/0126761 A1 * | 5/2016 | Sanford ................ A47F 3/005 320/134 |

\* cited by examiner

SYSTEM AND METHOD FOR PROLONGING BATTERY LIFE

CROSS-REFERENCE TO RELATED APPLICATIONS

This application claims the benefit of U.S. Provisional Application No. 62/346,803 filed on Jun. 7, 2016, the contents of which are hereby incorporated by reference.

TECHNICAL FIELD

The present disclosure relates generally to rechargeable batteries, and more particularly to prolonging useful lifetimes of rechargeable batteries.

BACKGROUND

Most rechargeable battery technologies eventually result in the battery degrading in its capacity to store charge over time. This is especially true for technologies such as lithium-ion and lithium polymer batteries. This degradation may occur due to a number of reasons, such as overcharge or deep discharge of the battery. As a result of the degradation, the battery, or in some cases an entire unit including the battery, will eventually require replacement. Frequent battery replacement is costly and inconvenient, and may be impractical in some parts of the world due to logistical concerns. Furthermore, disposal of batteries is expensive due to some environmental regulations. For some purposes, there may be an advantage to battery degradation, as this encourages users to replace devices every few years, increasing revenue for manufacturers. However, there are uses, such as off-grid power storage, where the cost of the rechargeable battery and the cost of replacement are significantly high such that it is desirable to prolong the lifetime of batteries and storage devices.

Additionally, some existing solutions focus on energy storages that typically provide power to a constant load such as, for example, a laptop battery, a phone battery, a cordless drill, and the like. As the load affects the charge-discharge cycle, the load may also affect the lifetime of the energy storage, particularly when fluctuating demands for energy are not adjuster for. Accordingly, existing solutions face challenges in adapting to dynamic loads.

It would therefore be advantageous to provide a solution that would overcome the challenges noted above.

SUMMARY

A summary of several example embodiments of the disclosure follows. This summary is provided for the convenience of the reader to provide a basic understanding of such embodiments and does not wholly define the breadth of the disclosure. This summary is not an extensive overview of all contemplated embodiments, and is intended to neither identify key or critical elements of all embodiments nor to delineate the scope of any or all aspects. Its sole purpose is to present some concepts of one or more embodiments in a simplified form as a prelude to the more detailed description that is presented later. For convenience, the term "some embodiments" or "certain embodiments" may be used herein to refer to a single embodiment or multiple embodiments of the disclosure.

Certain embodiments disclosed herein include a method for prolonging battery life. The method comprises: determining, based on a first set of test storage data of the test energy storage, a first set of test configuration parameters comprising a first maximum charge level for the test energy storage, wherein the first set of test configuration parameters corresponds to a first estimated useful life; determining, based on a second set of test storage data of the test energy storage, a second set of test configuration parameters comprising a second maximum charge level for the test energy storage, wherein the second set of test configuration parameters corresponds to a second estimated useful life; and sending, to a controller of the test energy storage, reconfiguration instructions, wherein the reconfiguration instructions are based on the second set of test configuration parameters, wherein the second estimated useful life is longer than the first estimated useful life.

Certain embodiments disclosed herein also include a non-transitory computer readable medium having stored thereon causing a processing circuitry to execute a process, the process comprising: determining, based on a first set of test storage data of the test energy storage, a first set of test configuration parameters comprising a first maximum charge level for the test energy storage, wherein the first set of test configuration parameters corresponds to a first estimated useful life; determining, based on a second set of test storage data of the test energy storage, a second set of test configuration parameters comprising a second maximum charge level for the test energy storage, wherein the second set of test configuration parameters corresponds to a second estimated useful life; and sending, to a controller of the test energy storage, reconfiguration instructions, wherein the reconfiguration instructions are based on the second set of test configuration parameters, wherein the second estimated useful life is longer than the first estimated useful life.

Certain embodiments disclosed herein also include a system for prolonging battery life. The system comprises: a processing circuitry; and a memory, the memory containing instructions that, when executed by the processing circuitry, configure the system to: determine, based on a first set of test storage data of the test energy storage, a first set of test configuration parameters comprising a first maximum charge level for the test energy storage, wherein the first set of test configuration parameters corresponds to a first estimated useful life; determine, based on a second set of test storage data of the test energy storage, a second set of test configuration parameters comprising a second maximum charge level for the test energy storage, wherein the second set of test configuration parameters corresponds to a second estimated useful life; and send, to a controller of the test energy storage, reconfiguration instructions, wherein the reconfiguration instructions are based on the second set of test configuration parameters, wherein the second estimated useful life is longer than the first estimated useful life.

BRIEF DESCRIPTION OF THE DRAWINGS

The subject matter disclosed herein is particularly pointed out and distinctly claimed in the claims at the conclusion of the specification. The foregoing and other objects, features, and advantages of the disclosed embodiments will be apparent from the following detailed description taken in conjunction with the accompanying drawings.

DETAILED DESCRIPTION

Figure 1:
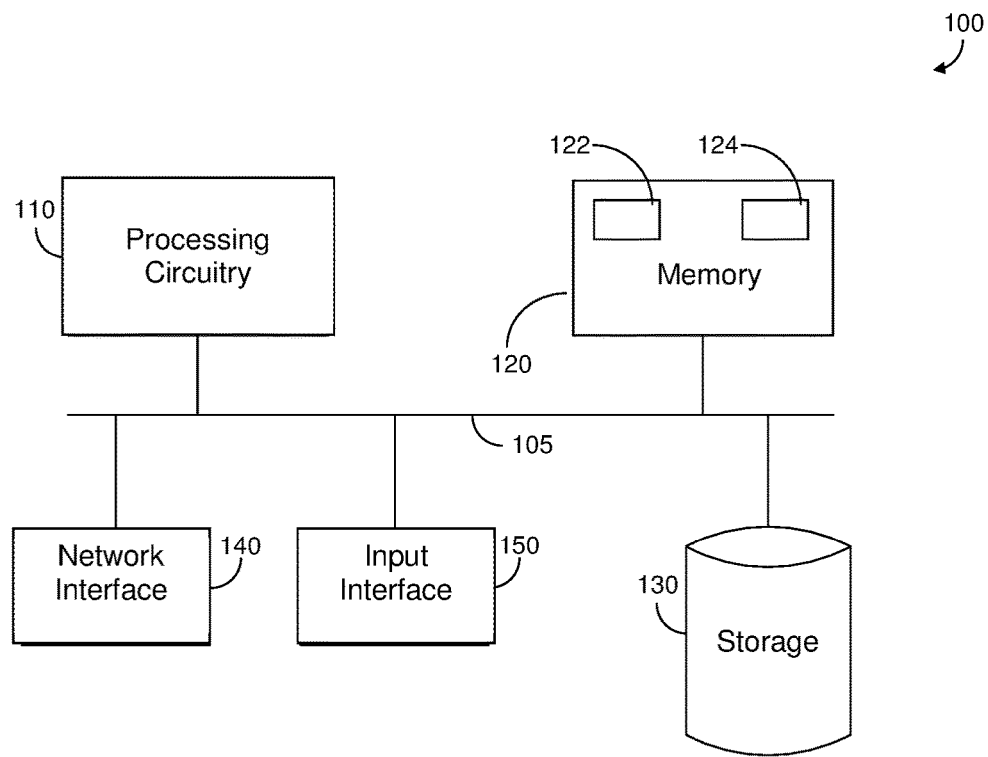
FIG. 1 is a schematic diagram of a charge regulator according to an embodiment.

It is important to note that the embodiments disclosed herein are only examples of the many advantageous uses of the innovative teachings herein. In general, statements made in the specification of the present application do not necessarily limit any of the various claimed embodiments. Moreover, some statements may apply to some inventive features but not to others. In general, unless otherwise indicated, singular elements may be in plural and vice versa with no loss of generality. In the drawings, like numerals refer to like parts through several views.

The various disclosed embodiments include a method and system for prolonging battery life. Storage data is received from a plurality of benchmarking energy storage apparatuses, each benchmarking energy storage apparatus including at least an energy storage, a communication circuit, and a charge regulator. Each benchmarking energy storage apparatus further includes or is connected to an energy source such as a solar panel. The storage data for each benchmarking energy storage apparatus may include a location, apparatus type, customer type, charge levels, depletion rates, and the like. A charging profile is created for each benchmarking energy storage apparatus. Each charging profile defines at least charging attributes related to charging and discharging of the respective benchmarking apparatus, and may further indicate environmental attributes related to circumstances of the operation of the benchmarking energy storage apparatus.

Input storage data is received from a test energy storage apparatus for which the life of the energy storage apparatus is to be prolonged. The input storage data is compared to the charging attributes, the environmental attributes, or both, of the plurality of charging profiles. Based on the comparison, a matching charging profile is identified. At least one configurable parameter of the test energy storage apparatus is reconfigured based on the matching charging profile.

FIG. 1 shows an example schematic diagram illustrating a charge control system 100 according to an embodiment. The charge control system 100 includes a processing circuitry 110, a memory 120, a storage 130, a network interface 140, and an input/output (I/O) interface 150. In an embodiment, the components of the charge control system 100 may be communicatively connected via a bus 105.

The processing circuitry 110 may be realized as one or more hardware logic components and circuits. For example, and without limitation, illustrative types of hardware logic components that can be used include field programmable gate arrays (FPGAs), application-specific integrated circuits (ASICs), Application-specific standard products (ASSPs), system-on-a-chip systems (SOCs), general-purpose microprocessors, microcontrollers, digital signal processors (DSPs), and the like, or any other hardware logic components that can perform calculations or other manipulations of information.

The memory 120 may be volatile (e.g., RAM, etc.), non-volatile (e.g., ROM, flash memory, etc.), or a combination thereof. In one configuration, computer readable instructions to implement one or more embodiments disclosed herein may be stored in the storage 130.

Alternatively or collectively, the memory 120 may be configured to store software. Software shall be construed broadly to mean any type of instructions, whether referred to as software, firmware, middleware, microcode, hardware description language, or otherwise. Instructions may include code (e.g., in source code format, binary code format, executable code format, or any other suitable format of code). The instructions, when executed by the one or more processors, cause the processing circuitry to control charging and discharging of a battery (not shown in FIG. 1).

The memory 120 may further include a memory portion 122 containing the instructions for causing the processing circuitry 110 to perform the various disclosed embodiments. In another embodiment, the memory 120 may further include a memory portion 124 containing power measurements received from a plurality of energy storage apparatuses with respect to energy sources such as solar panels of each energy storage apparatus.

The storage 130 may be magnetic storage, optical storage, and the like, and may be realized, for example, as flash memory or other memory technology, CD-ROM, Digital Versatile Disks (DVDs), or any other medium which can be used to store the desired information. The storage 130 may store instructions for executing the methods as described herein.

The network interface 140 and the input interface 150 allow the charge control system 100 to communicate with a network (e.g., the network 310, FIG. 3) for purposes such as, but not limited to, receiving storage data, sending instructions for reconfiguring an energy storage apparatus, and the like.

Figure 2:
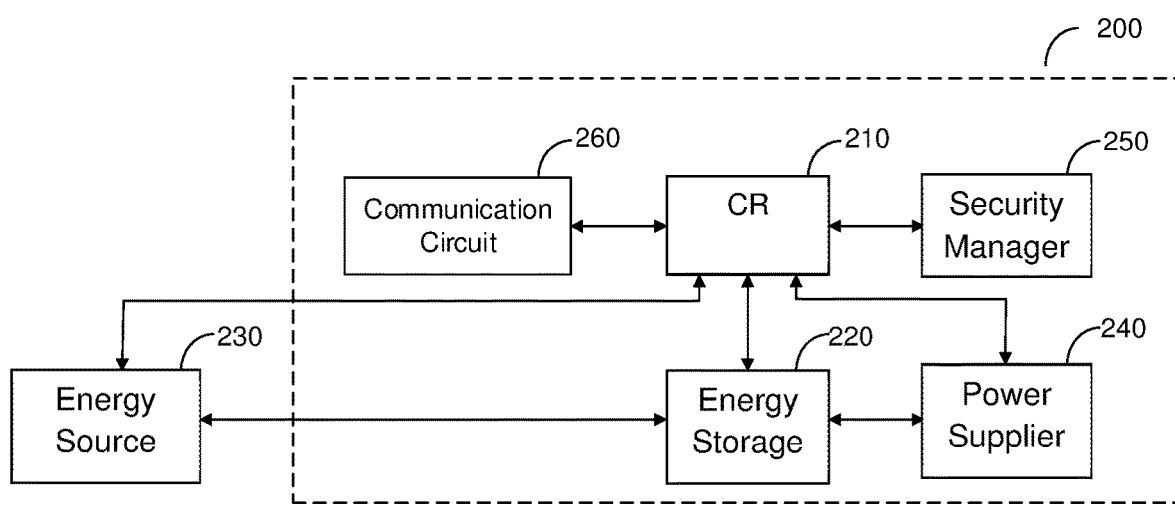
FIG. 2 is a schematic diagram of an energy storage apparatus utilized according to an embodiment.

FIG. 2 is an example schematic diagram illustrating an energy storage apparatus 200 utilized according to an embodiment. The energy storage apparatus 200 includes a charge regulator (CR) 210 communicatively connected to an energy storage 220, an energy source 230, a power supplier 240, a security manager 250, and a communication circuit 260. The components of the energy storage apparatus 200 can be integrated into a single housing, or can be separately housed and interconnected via wires or wirelessly.

In an embodiment, the charge regulator 210 is configured to control charging and discharging of energy to or from the energy storage 220. The energy storage 220 stores energy generated or otherwise provided by the energy source 230, and the power supplier 240 obtains energy stored in the energy storage 220 for delivery to one or more energy withdrawing devices (not shown). The energy storage may be or may include a rechargeable energy storage device such as, e.g., a lithium-ion or lithium-polymer battery. In another embodiment, the energy storage may further include a capacitor or a supercapacitor.

The energy source 230 provides energy for charging the energy storage 220. In an example implementation, the energy source 230 generates renewable energy based on environmental energy sources such as, but not limited to, the sun (i.e., solar energy), water (e.g., hydroelectric or wave generators), wind, and the earth (i.e., geothermal energy). To this end, the energy source 230 may be or may include at least one solar panel, at least one photovoltaic panel, a hydroelectric generator, a wave generator, a wind turbine, and the like.

In some implementations, the energy storage apparatus 200 may be a hybrid device configure to store energy generated by the energy source 230 and from, e.g., an electrical grid (not shown). To this end, the energy storage apparatus 200 may be connected to an electrical grid via, e.g., a voltage converter (not shown), and the charge regulator 210 may be configured to store energy from the electrical grid in the energy storage 220.

Over use during a high number of charge cycles, the energy storage 220 loses capacity. As a non-limiting example, a battery at full capacity may store a higher total amount of charge after 5 charge cycles than after 500 charge cycles. Further damage to the energy storage 220 may occur when, e.g., the energy storage 220 is overcharged or subjected to a deep discharge. To this end, in an embodiment, the charge regulator 210 is configured to control charging and discharging of the energy storage 220 based on an expected supply (i.e., an estimated load) on the energy storage 220 to prolong the useful life of the energy storage 22. Example methods for prolonging battery life are described further herein below with respect to FIGS. 4 and 6-7.

As a non-limiting example, for a battery having a 100% capacity of 5,000 mAh (mili-Amperes per hour), an estimated load consumes current of about 2,000-3,000 mAh. Based on the estimated load, the charge regulator 210 is configured to determine a maximum charge level of 4,000 mAh (i.e., at most charged, i.e., depth of discharged, is to 80% of total capacity) and a maximum discharge level of 1,000 mAh (i.e., at most discharged down to 20% of total capacity). That is, the battery is not charged to its full capacity and not fully discharged. As a result, there may be little to no effect from a user's perspective, but the useful life of the battery (i.e., the example energy storage 220) is prolonged, thereby resulting in an increase in the total number of charge cycles the battery may perform without needing to be replaced.

The security manager 250 may be configured to detect unauthorized access events related to the energy storage apparatus 200. Unauthorized access events may include, but are not limited to, attempting to bypass the charge regulator 210, attempting to access the energy storage 220 directly, attempting to obtain energy from the energy storage apparatus 200 while failing to comply with at least one access rule, and the like. The at least one access rule may include providing sufficient payment to meet a payment requirement, and may be met based on secure tokens received by the security manager 250 indicating that sufficient payment has been made.

The security manager 250 may be configured to cause the charge regulator 210 to cease distribution of power from the energy storage 220 or to enter a reduced power mode upon detection of an unauthorized access event. In an example implementation, the reduced power mode may be a "trickle" power mode such that, in the trickle power mode, the energy storage apparatus 200 stores only the minimum amount of power required to maintain at least one basic function of the energy storage apparatus 200 (e.g., keeping a battery sufficiently charged to prevent damage thereto). The security manager 250 may further cause the charge regulator 210 to resume a normal power mode once the unauthorized access event is over. Switching to the reduced power mode may be utilized to prevent the unauthorized access attempt while preventing damage to or failure of at least a portion of the energy storage apparatus 200.

The security manager 250 may include or be communicatively connected to at least one sensor (not shown) such as, but not limited to, motion sensors, trip sensors, accelerometers, and the like, and unauthorized access events may be detected when bypass attempts are made as determined based on sensor signals from the at least one sensor. For example, an unauthorized access event may be detected when a sensor utilized to monitor a connection between the power supplier 240 and the energy storage 220 is tripped (i.e., when movement that may be related to bypassing the power supplier 240 and accessing the energy storage 220 directly is detected).

Figure 3:
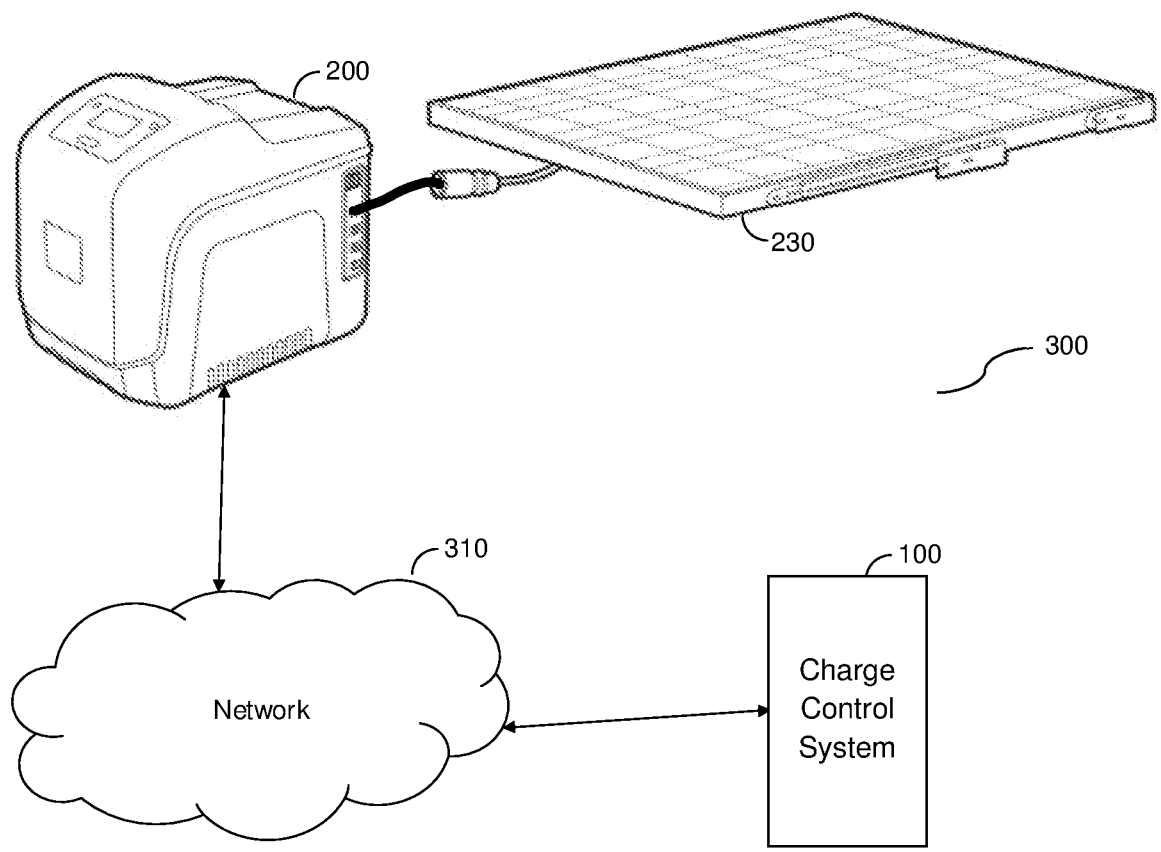
FIG. 3 is a network diagram illustrating a charge control system and a renewable energy power station.

The communication circuit 260 is configured to enable communications between the energy storage apparatus 200 and, for example, a network (e.g., the network 310, FIG. 3). The communications may be utilized for purposes such as, but not limited to, sending storage data, receiving instructions for reconfiguring the charge regulator 210, and the like.

The energy storage apparatus 200 may include a processing circuitry (not shown) coupled to a memory (not shown). In an example implementation, the processing circuitry and memory may be included in the charge regulator 210. Some examples for implementing the processing circuity and memory in the apparatus 220 are provided above with reference to FIG. 1.

It should be noted that the memory of the apparatus 220 may include instructions, when executed by the processing circuitry, cause the processing circuitry to regulate energy charging and discharging and switching between normal and reduced power modes. The instructions may further configure the processing circuitry to determine power measurements based on energy generated by the energy source 230, energy stored in the energy storage 220 from the energy source 230, and the like.

FIG. 3 is an example network diagram 300 illustrating the charge control system 100 communicatively connected to the energy storage apparatus 200 via a network 310. In the example network diagram 300, the energy source 230 is a solar panel configured to charge a battery (e.g., the energy storage 220) of the energy storage apparatus 200. The network 310 may be, but is not limited to, the Internet, the world-wide-web (WWW), a local area network (LAN), a wide area network (WAN), a metro area network (MAN), and other networks capable of enabling communication between the elements of the network diagram 300. In a further embodiment, the network 310 may be a cellular network.

The charge control system 100 may be configured to receive storage data from the energy storage apparatus 200 via the network 310. The storage data may include, but is not limited to, energy storage capacity, energy storage charge over time, total time spent recharging the energy storage 220, rate of discharge, current supply from the energy storage 220 to another component of the energy storage apparatus 200 (e.g., to the power supplier 240), and the like.

Based on the received storage data, the charge control system 100 is configured to determine at least a matching charging profile and one or more instructions for reconfiguring the charge regulator 210 to prolong the useful life of the energy storage apparatus 200. The charge control system 100 may be further configured to determine an estimated useful lifetime of the energy storage 220 based on the storage data. For example, the estimated useful lifetime may be determined based on a known aging model for a type of the energy storage 220 and the storage data.

Figure 4:
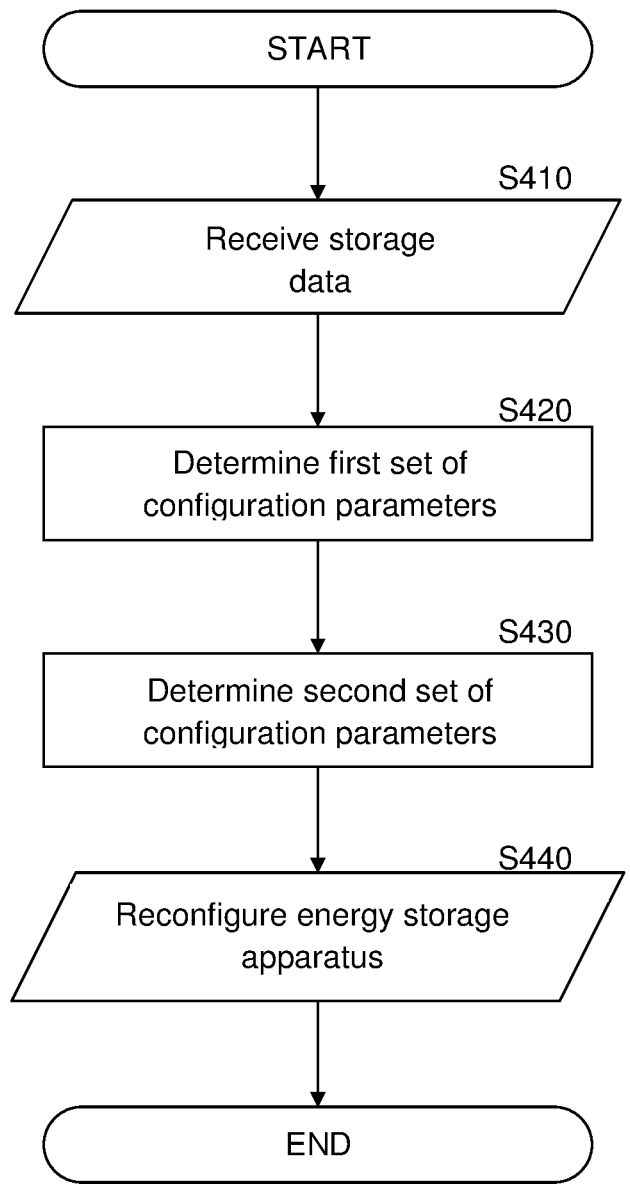
FIG. 4 is a flowchart illustrating a method for prolonging battery life according to an embodiment.

FIG. 4 is an example flowchart 400 illustrating a method for prolonging battery life according to an embodiment. In an embodiment, the method may be performed by the charge control system 100 to prolong the useful life of, e.g., the energy storage 220 of the energy storage apparatus 200.

At S410, a first set of storage data is received. The first set of storage data may be received from an energy storage apparatus (e.g., the energy storage apparatus 200). The storage data is related to at least one energy storage and may include data related to charging and discharging of the energy storage, circumstances related to the storage (e.g., circumstances indicating a type of the energy storage, a user of the energy storage, etc.), or both. To this end, the first set of storage data may include, but is not limited to, energy storage capacity, energy storage charge over time, total time spent recharging the energy storage, rate of discharge, current supply from the energy storage to another component of the energy storage apparatus (e.g., to a power supplier connected to the energy storage apparatus), location, apparatus type, customer type, charge levels, depletion rates, and the like.

At S420, a first set of at least one configuration parameter is determined based on the first set of storage data. In an embodiment, the first set of configuration parameters includes a first maximum charge level defining a maximum amount of charge above which the energy storage is not to be charged. In a further embodiment, the first set of configuration parameters may also include a first minimum charge level defining a minimum amount of charge below which the energy storage is not to be discharged. In an embodiment, S420 may further include determining a first estimated useful life with respect to the first set of configuration parameters. For example, this may be performed by comparing energy storage data to a known aging model for, e.g., a battery chemistry of the energy storage. The known aging model may be utilized to determine, e.g., an estimated numbers of cycles for an energy storage such as a battery given various parameters. The first estimated useful life may be determined based on the first set of configuration parameters.

In an embodiment, the first maximum charge level is lower than a total capacity of the energy storage indicated in the storage data. This may be desirable to, for example, avoid overcharging of the energy storage. Additionally, a buffer may be utilized to further reduce the likelihood of overcharging. To this end, in an example implementation, the first maximum charge level may be determined based on an initial maximum charge level and a predetermined buffer value. As a non-limiting example, when a total capacity of a battery is 5,000 mAh, a buffer value of 5% is utilized, and an initial maximum charge level is determined to be 4,000 mAh (e.g., based on the storage data), the first maximum charge level may be determined to be 3,800 mAh such that the battery is not charged to an energy level above 3,800 mAh.

At S430, a second set of at least one configuration parameter for configuring the energy storage apparatus or a portion thereof is determined based on a second set of storage data. In an embodiment, the second set of storage data may be or may include the first set of storage data. Alternatively or collectively, S430 may include receiving additional storage data and determining, based on the additional storage data, the first set of storage data, or both, the second set of configuration parameters. The additional storage data may include, e.g., storage data received during a time period of operation of the energy storage apparatus such as, but not limited to, one day. In an embodiment, the second set of configuration parameters may include a second maximum charge level. In a further embodiment, S430 may include determining the second maximum charge level based on a total load handled by the energy storage apparatus during the time period. The second maximum charge level may be determined based on, e.g., a charge model and the second set of configuration parameters.

At S440, at least one instruction for reconfiguring the energy storage apparatus is sent to the energy storage apparatus (e.g., sent to a charge regulator of the energy storage apparatus that is configured to control charging and discharging from an energy storage of the energy storage apparatus). The at least one instruction may be based on the determined second set of configuration parameters. In an embodiment, S440 may further include determining a second estimated useful life with respect to the second set of configuration parameters. The second estimated useful life is longer than the first estimated useful life. The second estimated useful life may be determined based on the aging model for the energy storage and the second set of configuration parameters.

Figure 5:
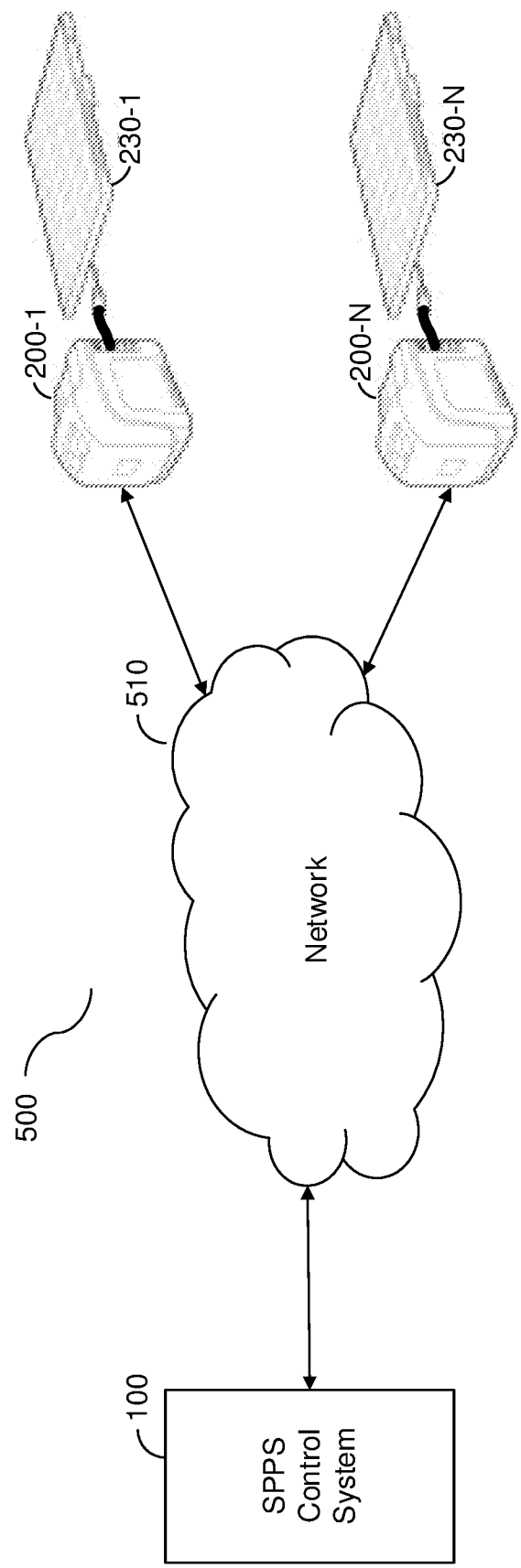
FIG. 5 is a network diagram illustrating a charge control system and a plurality of renewable energy power stations.

FIG. 5 is an example network diagram 500 illustrating the charge control system 100 communicatively connected to a plurality of energy storage apparatuses 200-1 through 200-N (hereinafter referred to individually as an energy storage apparatus 200 and collectively as energy storage apparatuses 200, merely for simplicity purposes) via a network 510. In the example network diagram 500, each energy storage apparatus 200 is connected to a corresponding energy source of a plurality of energy sources 230-1 through 230-N (hereinafter referred to individually as an energy source 230 and collectively as energy sources 230, merely for simplicity purposes), where each energy source 230 is a solar panel configured to charge a battery (e.g., the energy storage 220) of the energy storage apparatus 200. The network 510 may be, but is not limited to, the Internet, the world-wide-web (WWW), a local area network (LAN), a wide area network (WAN), a metro area network (MAN), and other networks capable of enabling communication between the elements of the network diagram 500.

The charge control system 100 may be configured to receive storage data from the energy storage apparatuses 200 via the network 310. The storage data may include, but is not limited to, energy storage capacity, energy storage charge over time, total time spent recharging each energy storage 220, rate of discharge, current supply from each energy storage 220 to another component of the respective energy storage apparatus 200 (e.g., to the power supplier 240), and the like. Based on the received storage data, the charge control system 100 is configured to create a plurality of charging profiles. The charging profiles may be utilized to determine reconfigurations for prolonging battery life for additional energy storage apparatuses as described herein. The charge control system 100 may be further configured to determine an estimated useful lifetime of each energy storage 220 based on the storage data.

It should be noted that a single solar panel energy source 230 is shown for each energy storage apparatus 200 of FIG. 5 merely for simplicity purposes and without limitation on the disclosed embodiments. Multiple energy sources may be connected to each energy storage apparatus 200 without departing from the scope of the disclosure. Further, multiple energy sources 230 may be utilized for one or more of the energy storage apparatuses 200 so as to provide a hybrid of, e.g., renewable energy from a solar panel and energy from a grid.

Figure 6:
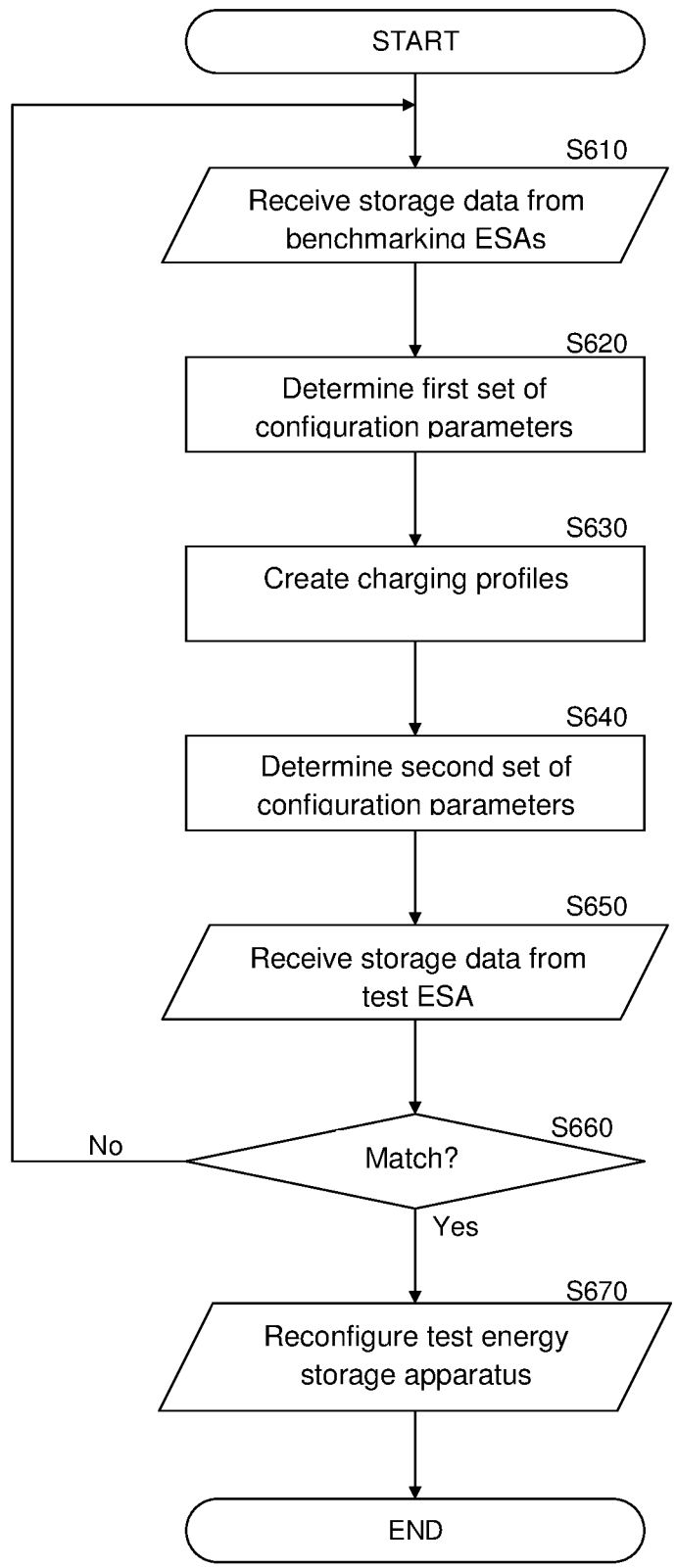
FIG. 6 is a flowchart illustrating a method for prolonging battery life based on a charging profile according to an embodiment.

FIG. 6 is an example flowchart 600 illustrating a method for prolonging battery life based on a charging profile according to an embodiment. In an embodiment, the method may be performed by the charge control system 100 to prolong the useful life of, e.g., the energy storage 220 of the energy storage apparatus 200.

At S610, benchmarking storage data is received from a plurality of benchmarking energy storage apparatuses (e.g., the energy storage apparatuses 200-1 through 200-N as shown in FIG. 5). The benchmarking storage data is related to a plurality of benchmarking energy storages of the benchmarking energy storage apparatuses and may include data related to charging and discharging of each benchmarking energy storage, circumstances related to each energy storage (e.g., data indicating a type of the energy storage, a user of the energy storage, etc.), or both. To this end, the benchmarking storage data may include, but is not limited to, energy storage capacity, energy storage charge over time, total time spent recharging each benchmarking energy storage, rate of discharge, current supply from each energy storage to another component of the energy storage apparatus (e.g., to a power supplier connected to the energy storage apparatus), location, apparatus type, customer type, charge levels, depletion rates, and the like. In some embodiments, the storage data may include data related to charge cycle completion such as, but not limited to, a number of charge cycles completed.

At S620, a first set of at least one configuration parameter for each benchmarking energy storage apparatus or a portion thereof is determined based on the benchmarking storage data. In an embodiment, the first set of configuration parameters of each benchmarking energy storage apparatus includes a first maximum charge level defining a maximum amount of charge to be held by the energy storage at a time. In a further embodiment, the first set of configuration parameters may also include a first minimum charge level defining a minimum amount of charge to be held by the energy storage at a time. In an embodiment, S620 may further include determining a first estimated useful life with respect to the first set of configuration parameters.

In an embodiment, the first maximum charge level is lower than a total capacity of the energy storage indicated in the storage data. This may be desirable to, for example, avoid overcharging of the energy storage. Additionally, a buffer may be utilized to further reduce the likelihood of overcharging. To this end, in an example implementation, the first maximum charge level may be determined based on an initial maximum charge level and a predetermined buffer value. As a non-limiting example, when a total capacity of a battery is 5,000 mAh, a buffer value of 5% is utilized, and an initial maximum charge level is determined to be 4,000 mAh (e.g., based on the storage data), the first maximum charge level may be determined to be 3,800 mAh such that the battery is not charged to an energy level above 3,800 mAh.

At S630, at least one charging profile is created based on the benchmarking storage data. Each charging profile is created with respect to at least one of the benchmarking energy storage apparatuses. Each charging profile indicates at least charging and discharging attributes of the at least one benchmarking energy storage apparatus.

Each charging profile may further include environmental attributes indicating circumstances that may affect optimal charging and discharging such as, but not limited to, location, system type, user type, and the like. The user type may be utilized to distinguish among different likely uses and, consequently, charging configurations for prolonging battery life. As a non-limiting example, usage of the energy storage apparatus by a home user (i.e., a user implementing the energy storage apparatus at his or her residence) is typically characterized by higher usage during the night (i.e., when the user is home) and lower usage during the day (i.e., when the user is, e.g., at work or school). As another non-limiting example, usage by a daytime business user (i.e., a user implementing the energy storage apparatus at a location of his or her daytime business) is typically characterized by higher usage during the day and lower usage at night.

In an embodiment, S630 may include receiving additional storage data captured during at least a particular period of time, where the charging profiles are created based on the additional storage data. The additional storage data may include, for example, charge levels during the time period, loads handled during the time period, maximum and minimum charges during the time period, charging rates during the time period, and the like.

At S640, a second set of at least one configuration parameter for configuring each of the benchmarking energy storage apparatus or a portion thereof is determined. In an embodiment, the second set of configuration parameters is determined based on the created charging profiles. In a further embodiment, S640 may include determining the second maximum charge levels based on a total load handled by each benchmarking energy storage apparatus during the time period. In an embodiment, S640 may further include determining a second estimated useful life with respect to the second set of configuration parameters. The second estimated useful life is longer than the first estimated useful life.

At S650, input storage data is received from a test energy storage apparatus including a test energy storage. The input storage data may include, but is not limited to, energy storage capacity, energy storage charge over time, total time spent recharging the test energy storage, rate of discharge, current supply from the test energy storage to another component of the test energy storage apparatus (e.g., to a power supplier connected to the test energy storage apparatus), location, apparatus type, customer type, charge levels, depletion rates, and the like.

At S660, it is determined if the input storage data matches one of the charging profiles and, if so, execution continues with S670; otherwise, execution continues with S610. In an embodiment, a match may be determined if one or more values of the input storage data is within a predetermined threshold of corresponding values of one of the charging profiles. As a non-limiting example, input storage data including a current supply from the test energy storage is within a threshold value of a current supply indicated in one of the charging profiles, a match may be determined.

At S670, at least one instruction for reconfiguring the test energy storage apparatus is sent to the test energy storage apparatus (e.g., sent to a charge regulator of the test energy storage apparatus that is configured to control charging and discharging from a test energy storage of the test energy storage apparatus). The at least one instruction is based on the matching charging profile.

In an embodiment, S670 may include determining, based on the matching charging profile, a set of instructions for reconfiguring the test energy storage apparatus. Determining instructions for reconfiguring energy storage apparatuses based on the matching charging profile allows for reconfiguring test energy storage apparatuses that are similar to a benchmarking energy storage apparatus in order to prolong battery life.

In some embodiments, the reconfiguration instructions include instructions for prioritizing charging the energy storage to a usage charge level. The usage charge level may correspond to an estimated or actual load supply required to be supplied by the test energy storage apparatus at one or more periods of time. The estimated load supply may be determined based on the matching charging profile, and may be further determined based on load supplies of one or more of the benchmarking energy storage apparatuses. In another embodiment, the actual load supply may be determined by repeatedly setting a charge level for the test energy storage and determining whether the charge level was sufficient to accommodate the required load until it is determined that the charge level was sufficient. The actual load supply may be adjusted over time, e.g., as an average of previous sufficient charge levels, or as a peak among sufficient charge levels.

Figure 7:
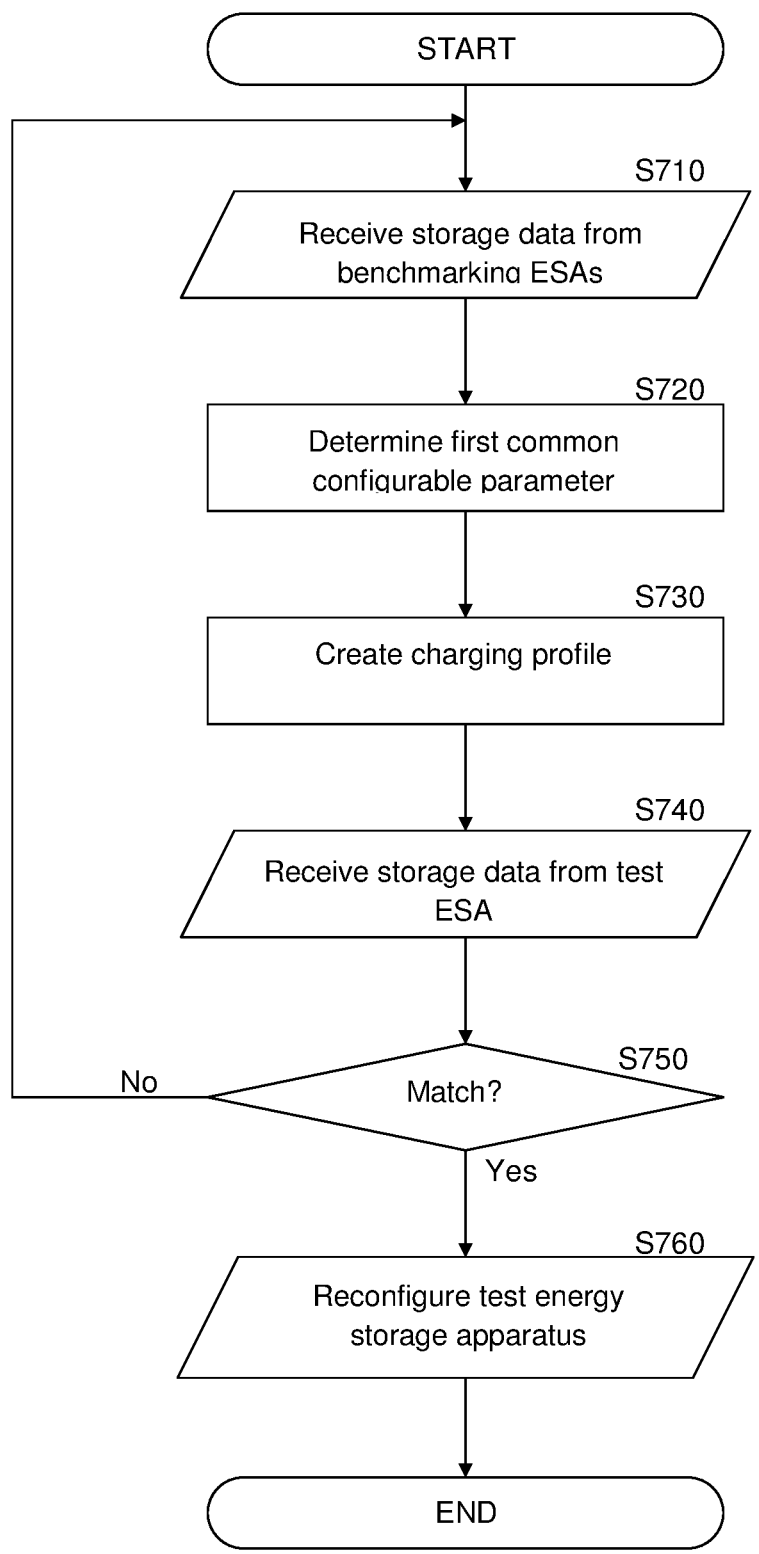
FIG. 7 is a flowchart illustrating a method for prolonging battery life with respect to common configurable attributes according to an embodiment.

FIG. 7 is an example flowchart 700 illustrating a method for prolonging battery life based on a charging profile according to an embodiment. In an embodiment, the method may be performed by the charge control system 100 to prolong the useful life of, e.g., the energy storage 220 of the energy storage apparatus 200.

At S710, benchmarking storage data is received from a plurality of benchmarking energy storage apparatuses (e.g., the energy storage apparatuses 200-1 through 200-N as shown in FIG. 5). The benchmarking storage data is related to a plurality of benchmarking energy storages of the benchmarking energy storage apparatuses and may include data related to charging and discharging of each benchmarking energy storage, circumstances related to each energy storage (e.g., data indicating a type of the energy storage, a user of the energy storage, etc.), or both. To this end, the benchmarking storage data may include, but is not limited to, energy storage capacity, energy storage charge over time, total time spent recharging each benchmarking energy storage, rate of discharge, current supply from each energy storage to another component of the energy storage apparatus (e.g., to a power supplier connected to the energy storage apparatus), location, apparatus type, customer type, charge levels, depletion rates, and the like. In some embodiments, the storage data may include data related to charge cycle completion such as, but not limited to, a number of charge cycles completed.

At S720, at least one common configurable parameter is determined for each energy storage apparatus or a portion thereof based on the benchmarking storage data. Each common configurable parameter may be, but is not limited to, a charge level, a priority for charging an energy storage over supplying charge to a power supplier or vice versa, a length of a charge cycle, and the like. Each type of determined common configurable parameter is determined for each energy storage apparatus.

At S730, a charging profile is created based on the determined common configurable parameter. Each charging profile indicates at least charging and discharging attributes of the at least one benchmarking energy storage apparatus.

Each charging profile may further include environmental attributes indicating circumstances that may affect optimal charging and discharging such as, but not limited to, location, system type, user type, and the like. The user type may be utilized to distinguish among different likely uses and, consequently, charging configurations for prolonging battery life. As a non-limiting example, usage of the energy storage apparatus by a home user (i.e., a user implementing the energy storage apparatus at his or her residence) is typically characterized by higher usage during the night (i.e., when the user is home) and lower usage during the day (i.e., when the user is, e.g., at work or school). As another non-limiting example, usage by a daytime business user (i.e., a user implementing the energy storage apparatus at a location of his or her daytime business) is typically characterized by higher usage during the day and lower usage at night.

In an embodiment, S730 may include receiving additional storage data captured during at least a particular period of time, where the charging profiles are created based on the additional storage data with respect to the common configurable attributes. The additional storage data may include, for example, charge levels during the time period, loads handled during the time period, maximum and minimum charges during the time period, charging rates during the time period, and the like.

At S740, input storage data is received from a test energy storage apparatus including a test energy storage. The input storage data may include, but is not limited to, energy storage capacity, energy storage charge over time, total time spent recharging the test energy storage, rate of discharge, current supply from the test energy storage to another component of the test energy storage apparatus (e.g., to a power supplier connected to the test energy storage apparatus), location, apparatus type, customer type, charge levels, depletion rates, and the like.

At S750, it is determined if the input storage data matches one of the charging profiles and, if so, execution continues with S760; otherwise, execution continues with S710. In an embodiment, a match may be determined if one or more values of the input storage data is within a predetermined threshold of corresponding values of one of the charging profiles. As a non-limiting example, input storage data including a current supply from the test energy storage is within a threshold value of a current supply indicated in one of the charging profiles, a match may be determined.

At S760, at least one instruction for reconfiguring the test energy storage apparatus is sent to the test energy storage apparatus (e.g., sent to a charge regulator of the test energy storage apparatus that is configured to control charging and discharging from a test energy storage of the test energy storage apparatus). The at least one instruction is based on the matching charging profile.

In an embodiment, S760 may include determining, based on the matching charging profile, a set of instructions for reconfiguring the test energy storage apparatus. Determining instructions for reconfiguring energy storage apparatuses based on the matching charging profile allows for reconfiguring test energy storage apparatuses that are similar to a benchmarking energy storage apparatus in order to prolong battery life.

In some embodiments, the reconfiguration instructions include instructions for prioritizing charging the energy storage to a usage charge level. The usage charge level may correspond to an estimated or actual load supply required to be supplied by the test energy storage apparatus at one or more periods of time. The estimated load supply may be determined based on the matching charging profile, and may be further determined based on load supplies of one or more of the benchmarking energy storage apparatuses. In another embodiment, the actual load supply may be determined by repeatedly setting a charge level for the test energy storage and determining whether the charge level was sufficient to accommodate the required load until it is determined that the charge level was sufficient. The actual load supply may be adjusted over time, e.g., as an average of previous sufficient charge levels, or as a peak among sufficient charge levels.

It should be noted that various embodiments disclosed herein are described with respect to prolonging battery life merely for simplicity purposes and without limitation on the disclosed embodiments. Useful lifetimes of energy storages other than batteries that may be charged and discharged and may degrade in performance over time due to, e.g., overcharging or deep discharging, may be equally prolonged without departing from the scope of the disclosure.

The various embodiments disclosed herein can be implemented as hardware, firmware, software, or any combination thereof. Moreover, the software is preferably implemented as an application program tangibly embodied on a program storage unit or computer readable medium consisting of parts, or of certain devices and/or a combination of devices. The application program may be uploaded to, and executed by, a machine comprising any suitable architecture. Preferably, the machine is implemented on a computer platform having hardware such as one or more central processing units ("CPUs"), a memory, and input/output interfaces. The computer platform may also include an operating system and microinstruction code. The various processes and functions described herein may be either part of the microinstruction code or part of the application program, or any combination thereof, which may be executed by a CPU, whether or not such a computer or processor is explicitly shown. In addition, various other peripheral units may be connected to the computer platform such as an additional data storage unit and a printing unit. Furthermore, a non-transitory computer readable medium is any computer readable medium except for a transitory propagating signal.

All examples and conditional language recited herein are intended for pedagogical purposes to aid the reader in understanding the principles of the disclosed embodiment and the concepts contributed by the inventor to furthering the art, and are to be construed as being without limitation to such specifically recited examples and conditions. Moreover, all statements herein reciting principles, aspects, and embodiments of the disclosed embodiments, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

It should be understood that any reference to an element herein using a designation such as "first," "second," and so forth does not generally limit the quantity or order of those elements. Rather, these designations are generally used herein as a convenient method of distinguishing between two or more elements or instances of an element. Thus, a reference to first and second elements does not mean that only two elements may be employed there or that the first element must precede the second element in some manner. Also, unless stated otherwise, a set of elements comprises one or more elements.

As used herein, the phrase "at least one of" followed by a listing of items means that any of the listed items can be utilized individually, or any combination of two or more of the listed items can be utilized. For example, if a system is described as including "at least one of A, B, and C," the system can include A alone; B alone; C alone; A and B in combination; B and C in combination; A and C in combination; or A, B, and C in combination.

What is claimed is:

1. A method comprising:
   receiving benchmarking storage data from a plurality of benchmarking energy storage devices, wherein said benchmarking storage data comprises, with respect to each of said benchmarking energy storage devices, at least (i) a charging profile, (ii) environmental and operational attributes, and (iii) an estimated useful life;
   obtaining test storage data from a test energy storage device, wherein said test storage data comprises environmental and operational attributes associated with said test energy storage device;
   comparing said benchmarking storage data with said test storage data, to identify at least one matching benchmarking energy storage device, based on a similarity between said attributes associated with said identified benchmarking energy storage device and said attributes associated with said test energy storage device; and
   adjusting a charging profile of said test energy storage device, based on said charging profile of said identified benchmarking energy storage device having a highest said estimated useful life.

2. The method of claim 1, wherein each of said charging profiles of said benchmark energy storage devices and said test energy storage device includes at least a minimum charge level and a maximum charge level.

3. The method of claim 1, wherein the said environmental and operational attributes of each of said benchmark energy storage devices and said test energy storage device includes at least one of: capacity, charge over time, total time spent recharging, rate of discharge, current supply, location, apparatus type, customer type, charge levels, and depletion rates.

4. The method of claim 1, wherein said test storage data is obtained during a time period of operation of the test energy storage.

5. The method of claim 1, wherein said
   comparing comprises determining said similarity when at least one said attributes associated with said identified benchmarking energy storage device is within a predetermined threshold of a corresponding attribute associated with said test energy storage.

6. The method of claim 1, wherein each of said benchmark energy storage devices and said test energy storage device includes at least one of: a lithium-ion battery, and a lithium-polymer battery.

7. a non-transitory computer readable medium having stored thereon instructions for causing a processing circuitry to:
   receive benchmarking storage data from a plurality of benchmarking energy storage devices, wherein said benchmarking storage data comprises, with respect to each of said benchmarking energy storage devices, at least (i) a charging profile, (ii) environmental and operational attributes, and (iii) an estimated useful life;
   obtain test storage data from a test energy storage device, wherein said test storage data comprises environmental and operational attributes associated with said test energy storage device;
   compare said benchmarking storage data with said test storage data, to identify at least one matching, benchmarking energy storage device, based on a similarity between said attributes associated with said identified benchmarking energy storage device and said attributes associated with said test energy storage device; and
   adjust a charging profile of said test energy storage device, based on said charging profile of said identified benchmarking energy storage device having a highest said estimated useful life.

8. A system comprising:
   a processing circuitry; and
   a memory, the memory containing instructions that, when executed by the processing circuitry, configure the system to:
   receive benchmarking storage data from a plurality of benchmarking energy storage devices, wherein said benchmarking storage data comprises, with respect to each of said benchmarking energy storage devices, at least (i) a charging profile, (ii) environmental and operational attributes, and (iii) an estimated useful life,
   obtain test storage data from a test energy source device, wherein said test storage data comprises environmental and operational attributes associated with said test energy storage device, compare said benchmarking storage data with said test storage data, to identify at least one matching benchmarking energy storage device, based on a similarity between said attributes associated with said identified benchmarking energy storage device and said attributes associated with said test energy storage device, and adjust a charging profile of said test energy storage device, based on said charging profile of said identified benchmarking energy storage device having a highest said estimated useful life.

9. The system of claim 8, wherein each of said charging profiles of said benchmark energy storage devices and said test energy storage device includes at least a first minimum charge level and a maximum charge level.

10. The system of claim 8, wherein said environmental and operational attributes of each of said benchmark energy storage devices and said test energy storage device includes at least one of: capacity, charge over time, total time spent recharging, rate of discharge, current supply, location, apparatus type, customer type, charge levels, and depletion rates.

11. The system of claim 8, wherein said test storage data is obtained during a time period of operation of the test energy storage.

12. The system of claim 8, wherein said comparing comprises determining said similarity when at least one said attributes associated with said identified benchmarking energy storage device is within a predetermined threshold of a corresponding attribute associated with said test energy storage.

13. The system of claim 8, wherein each of said benchmark energy storage devices and said test energy storage device is any of: a lithium-ion battery, and a lithium-polymer battery.

* * * * *